(12) United States Patent
Kim

(10) Patent No.: US 8,319,427 B2
(45) Date of Patent: Nov. 27, 2012

(54) LIGHT EMITTING APPARATUS AND LIGHT UNIT

(75) Inventor: Ki Bum Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 49 days.

(21) Appl. No.: 12/868,243

(22) Filed: Aug. 25, 2010

(65) Prior Publication Data

US 2011/0050074 A1 Mar. 3, 2011

(30) Foreign Application Priority Data

Aug. 26, 2009 (KR) ........................ 10-2009-0079029

(51) Int. Cl.
*H01J 1/62* (2006.01)
(52) U.S. Cl. ........................................ 313/512; 313/498
(58) Field of Classification Search .................. 313/498, 313/506, 509, 512
See application file for complete search history.

(56) References Cited

U.S. PATENT DOCUMENTS

| | | | |
|---|---|---|---|
| 7,067,848 | B1 | 6/2006 | Lee et al. |
| 7,150,553 | B2 * | 12/2006 | English et al. ................ 362/545 |
| 7,181,010 | B2 | 2/2007 | Russ et al. |
| 7,187,010 | B2 * | 3/2007 | Tsukagoshi .................... 257/99 |
| 7,497,596 | B2 * | 3/2009 | Ge ................................. 362/294 |
| 7,612,385 | B2 * | 11/2009 | Kim et al. ........................ 257/99 |
| 2001/0030866 | A1 * | 10/2001 | Hochstein ..................... 362/294 |
| 2005/0068776 | A1 * | 3/2005 | Ge ................................. 362/296 |
| 2005/0236638 | A1 * | 10/2005 | Tsukagoshi .................... 257/99 |
| 2006/0043401 | A1 | 3/2006 | Lee et al. |
| 2006/0180925 | A1 | 8/2006 | Lee et al. |
| 2007/0085101 | A1 | 4/2007 | Kim |
| 2007/0235739 | A1 | 10/2007 | Sun et al. |
| 2008/0149960 | A1 | 6/2008 | Amo et al. |
| 2009/0072261 | A1 | 3/2009 | Wu |
| 2009/0114937 | A1 | 5/2009 | Kawakubo |

FOREIGN PATENT DOCUMENTS

| | | |
|---|---|---|
| EP | 0539095 A2 | 4/1993 |
| EP | 1139439 A1 | 10/2001 |
| EP | 1467414 A1 | 10/2004 |
| EP | 1970968 A1 | 9/2008 |
| JP | 2008-172196 A | 7/2008 |
| KR | 10-2006-0004569 A | 1/2006 |
| KR | 10-2008-0100317 A | 11/2008 |
| KR | 10-2009-0022177 A | 3/2009 |
| KR | 10-2009-0046701 A | 5/2009 |
| WO | WO 02/069409 A1 | 9/2002 |
| WO | WO 02/084749 A2 | 10/2002 |
| WO | WO 2007/106653 A2 | 9/2007 |

OTHER PUBLICATIONS

English translation of KR-10-2006-0004569-A.
English translation of KR-10-2009-0022177-A.

* cited by examiner

*Primary Examiner* — Vip Patel
(74) *Attorney, Agent, or Firm* — Birch, Stewart, Kolasch & Birch, LLP

(57) ABSTRACT

A light emitting apparatus according to an embodiment includes: a body including a cavity; an electrode of which one end is disposed in the cavity by penetrating the body and the other end is disposed outside of the body; a heat radiating member including a main frame which is coupled with the body to form the bottom of the cavity and a sub frame which extends from the main frame, wherein the top surface of the main frame has a larger area than the bottom surface of the main frame and the sub frame includes a slope; and a light emitting device installed on the heat radiating member and electrically connected with the electrode.

17 Claims, 6 Drawing Sheets

LIGHT EMITTING APPARATUS AND LIGHT UNIT

The present application claims priority under 35 U.S.C. §119(a) of Korean Patent Application No. 10-2009-0079029 filed on Aug. 26, 2009, which is hereby incorporated by reference in its entirety.

BACKGROUND OF THE INVENTION

1. Field of the Invention

An embodiment relates to a light emitting apparatus and a light unit.

2. Description of the Related Art

In recent years, a light emitting apparatus and a lighting system using a light emitting device as a light source have been widely used. The light emitting diode (LED) may configure the light source that generate light by using compound semiconductor materials such as GaAs-series, AlGaAs-series, GaN-series, InGaN-series, and InGaAlP-series.

Meanwhile, since the emission characteristics of the LED are deteriorated due to heat, the light emitting apparatus and the lighting system that have the LED need to be designed to rapidly emit heat emitted from the LED to the outside.

SUMMARY OF THE INVENTION

Embodiments provide a light emitting apparatus and a light unit having new structures.

Embodiments provide a light emitting apparatus and a light unit having improved heat radiation characteristics.

A light emitting apparatus according to an embodiment includes: a body including a cavity; an electrode of which one end is disposed in the cavity by penetrating the body and the other end is disposed outside of the body; a heat radiating member including a main frame which is coupled with the body to form the bottom of the cavity and a sub frame which extends from the main frame, wherein the top surface of the main frame has a larger area than the bottom surface of the main frame and the sub frame includes a slope; and a light emitting device installed on the heat radiating member and electrically connected with the electrode.

A light unit according to another embodiment includes: a light emitting apparatus including a body including a cavity, an electrode of which one end is disposed in the cavity by penetrating the body and the other end is disposed outside of the body, a heat radiating member coupled with the body, of which at least a part protrudes downwards from the bottom of the body, and a light emitting device installed on the heat radiating member and electrically connected with the electrode; and a substrate disposed below the light emitting apparatus, into which at least a part of the heat radiating member is inserted.

DETAILED DESCRIPTION OF THE PREFERRED EMBODIMENTS

Figure 1:
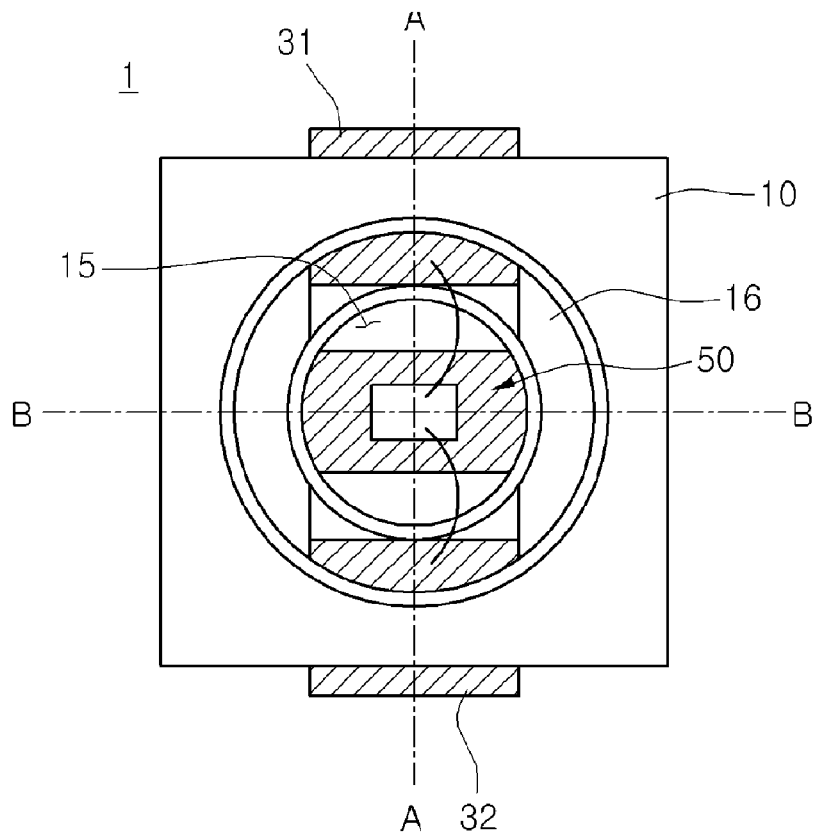
FIG. 1 is a top view of a light emitting apparatus according to a first embodiment.

In describing embodiments, it will be understood that when layers (films), regions, patterns, or structures are referred to as being "on" or "under" a substrate, layers (films), regions, pads, or patterns, "on" and "under" include "directly" or "indirectly". Further, "on" or "under" will be described on the basis of the drawings.

In the drawings, thicknesses or sizes of layers are exaggerated, omitted, or schematically illustrated for convenience and clarity of description. Further, sizes and actual sizes of constituent members are not fully reflected.

Hereinafter, a light emitting apparatus and a lighting light unit according to embodiments of the present invention will be described in detail with reference to the accompanying drawings.

Figure 2:
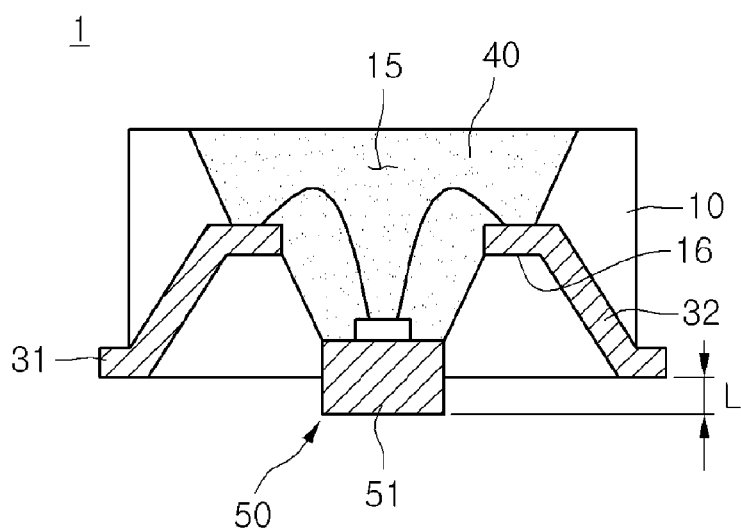
FIG. 2 is a cross-sectional view taken along line A-A' of FIG. 1.
Figure 3:
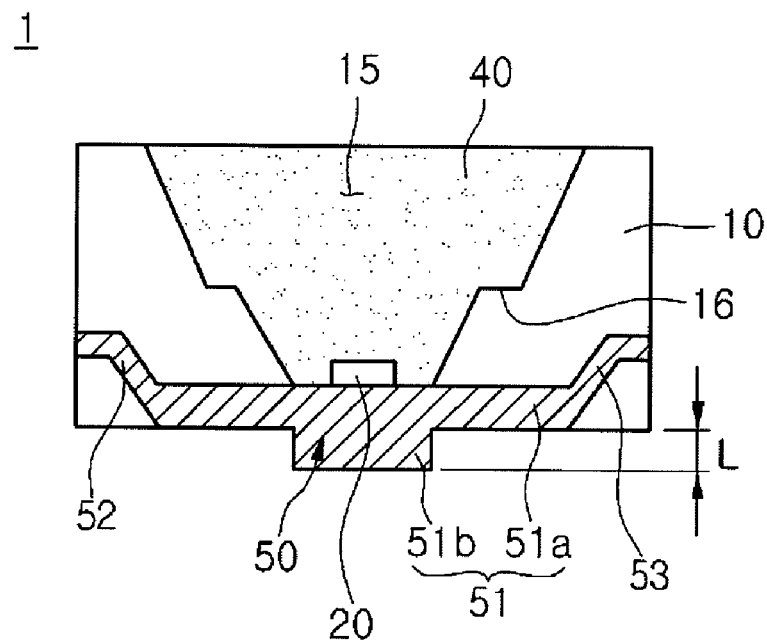
FIG. 3 is a cross-sectional view taken along line B-B' of FIG. 1.

FIG. 1 is a top view of a light emitting apparatus according to a first embodiment, FIG. 2 is a cross-sectional view taken along line A-A' FIG. 1, and FIG. 3 is a cross-sectional view taken along line B-B' of FIG. 1.

Referring to FIGS. 1 to 3, the light emitting apparatus 1 includes a body 10 including a cavity 15, a light emitting device 20 in the body 10, a first electrode 31 and a second electrode 32 of which ends are disposed in the body 10 and which are electrically connected with the light emitting device 20, a heat radiating member 50 thermally connected with the light emitting device 20, of which at least a part protrudes from the bottom of the body 10, and an encapsulant 40 formed in the cavity 15 to seal the light emitting device 20. The encapsulant 40 may include a phosphor luminescent substance.

The body 10 may be made of any one of a ceramic material, a silicon material, and a resin material. However, the material of the body 10 is not limited.

The body 10 may be integratively formed by injection molding or may be formed by stacking a plurality of layers.

The cavity 15 of which the top is opened may be formed in the body 10. When the body 10 is formed by stacking the plurality of layers, the cavity 15 may be formed by a patterning process, a punching process, a cutting process, or an etching process. Further, when the body 10 is formed by the injection molding, the cavity 15 may be formed by a metal frame made after the shape of the cavity 15.

The cavity 15 may have a cup shape, a concave vessel shape, and the like. Further, although the surface of the cavity 15 has a circular shape, but is not limited thereto and for example, may have a polygonal shape, an oval shape, and the like.

The inner surface of the body 10 forming the cavity 15 may be formed by a vertical side or an inclined side by considering a light distribution angle of the light emitting apparatus 1. Further, as shown in the figure, a stepped section 16 may be formed on the inner surface of the body 10 forming the cavity 15. One end of each of the first and second electrodes 31 and 32 may be disposed at the stepped section 16.

Meanwhile, the stepped section 16 or/and the cavity 15 may not be formed depending on the design of the light emitting apparatus 1 and is not limited thereto.

The surface of the cavity 15 may be coated or applied with a material having high reflecting effect, i.e., white photo solder resist (PSR) ink, silver (Ag), aluminum (Al), and the like and as a result, the emission efficiency of the light emitting apparatus 1 may be improved.

The one end of each of the first and second electrodes 31 and 32 may be disposed in the body 10 and at least a part of the other end of each of the first and second electrodes 31 and 32 may be exposed through the side of the body 10.

The one end of each of the first and second electrodes 31 and 32 is electrically connected with the light emitting device 20 and the other end of each of the first and second electrodes 31 and 32 is electrically connected with a substrate (not shown) equipped with the light emitting device 20 to transfer electric power to the light emitting device 20.

As shown in FIGS. 1 and 2, the one end of each of the first and second electrodes 31 and 32 is disposed on the stepped section 16 that is formed on the inner surface of the body 10 forming the cavity 15 and the other end may be exposed through the outer bottom of the body 10.

However, the arrangement and shapes of the first and second electrodes 31 and 32 may be variously changed depending on the design of the light emitting apparatus 1. Further, a plurality of electrodes may be additionally formed in addition to the first and second electrodes 31 and 32 and the present invention is not limited thereto.

Figure 4:
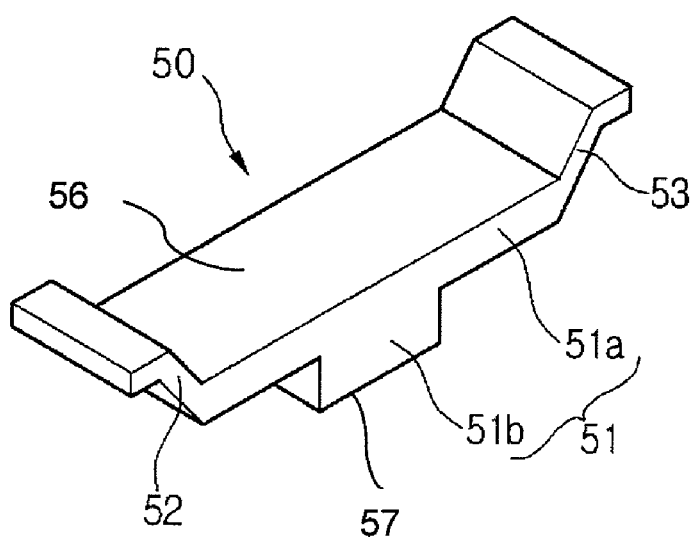
FIG. 4 is a perspective view of a heat radiating member.

FIG. 4 is a perspective view of a heat radiating member of a light emitting apparatus according to an embodiment.

Referring to FIGS. 1 to 4, the heat radiating member 50 includes a main frame 51 supporting the light emitting device 20, of which at least a part protrudes on the bottom of the body 10 by penetrating the bottom surface of the body 10 and first and second sub frames 52 and 53 that extend from the main frame 51. However, the shape of the heat radiating member 50 is not limited.

The first and second sub frames 52 and 53 strongly couple the heat radiating member 50 to the body 10 and may emit heat generated from the light emitting device 20.

However, the first and second sub frames 52 and 53 may not be formed or may have various shapes.

The main frame 51 supports the light emitting device 20 and receives the heat generated from the light emitting device 20.

The main frame 51 includes a first part 51a supporting the light emitting device 20 and a second part 51b protruding toward the lower side from the first part 51a.

The bottom of the first part 51a may be disposed on the same horizontal surface as the bottom of the body 10 and the bottom of the second part 51b is disposed below the bottom of the body 10.

The top of the first part 51a has an area larger than the bottom of the second part 51b. That is, the top surface 56 of the main frame 51 may have an area larger than the bottom surface 57 of the main frame 51.

The width of the second part 51b may be smaller than that of the first part 51b.

The second part 51b may protrude on the first part 51a by a first length L. When the bottom of the first part 51a is disposed on the same horizontal surface as the bottom of the body 10, the second part 51b may protrude on the bottom of the body 10 by the first length L.

Since the second part 51b protrudes on the bottom of the body 10 by the first length L, the second part 51b is excellent in physical coupling or thermal coupling with a substrate or a support member where the light emitting apparatus 1 is installed and may rapidly discharge the heat generated from the light emitting apparatus 1 to the outside.

The first and second sub frames 52 and 53 extend on the main frame 51 to be exposed toward the side of the body 10 and the first and second sub frames 52 and 53 may protrude on the side of the body 10.

The first and second sub frames 52 and 53 include an inclined surface inclined upwards from the main frame 51 and ends of the first and second sub frames 52 and 53 may be formed in parallel to the bottom of the body 10 or the main frame 51.

The heat radiating member 50 may be made of a material having high thermal conductivity, i.e., metal, resin, and the like and it is not limited thereto.

Hereinafter, the operation of the heat radiating member 50 of the light emitting apparatus 1 will be described in detail.

Figure 5:
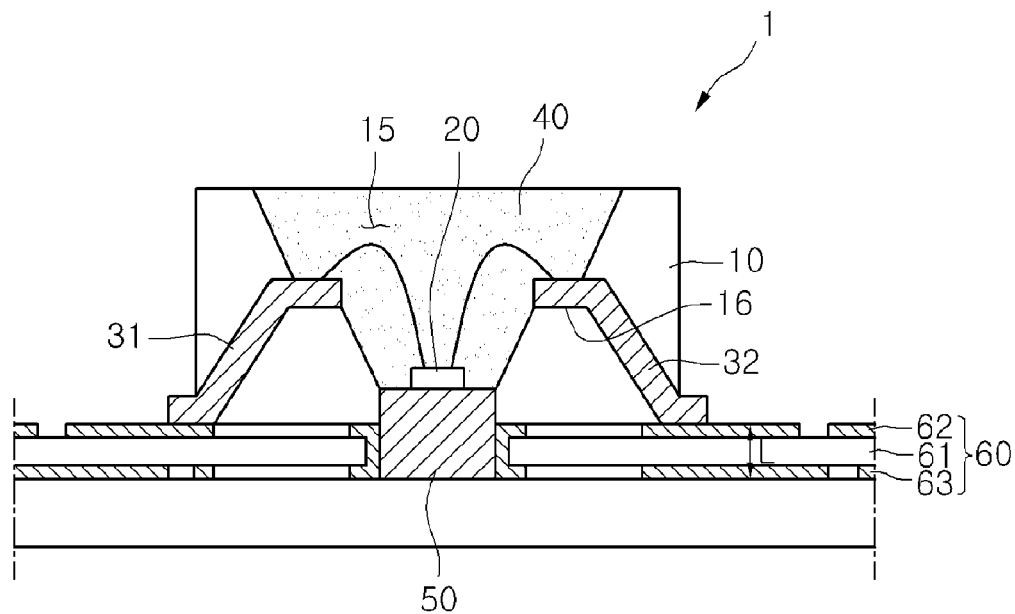
FIG. 5 is a cross-sectional view of a light unit including the light emitting apparatus.
Figure 6:
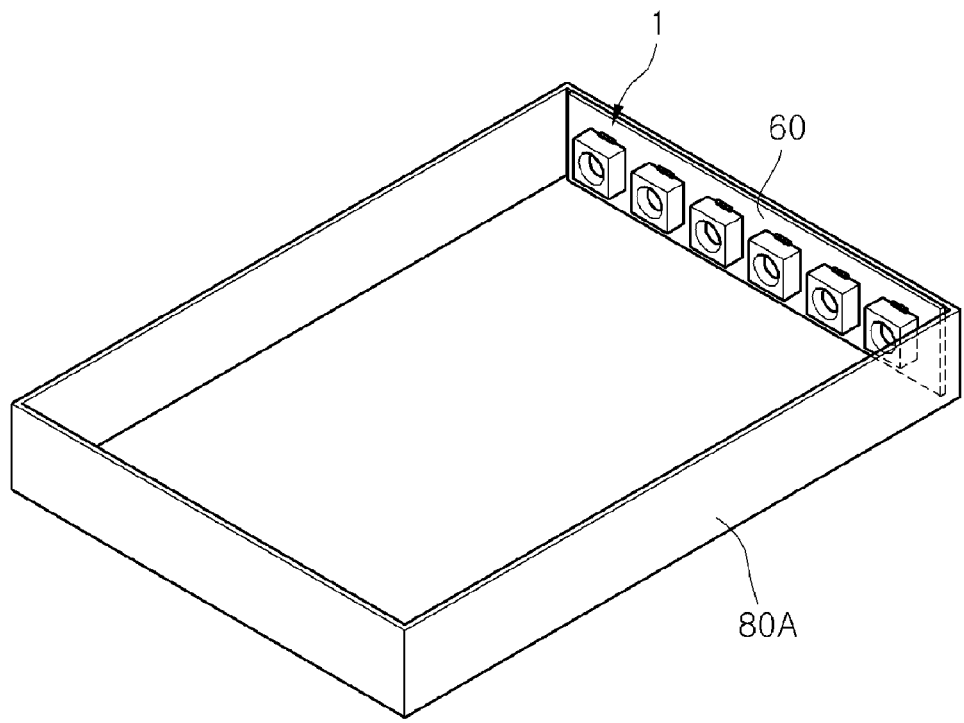
FIGS. 6 and 7 are perspective views of a light unit including the light emitting apparatus.
Figure 7:
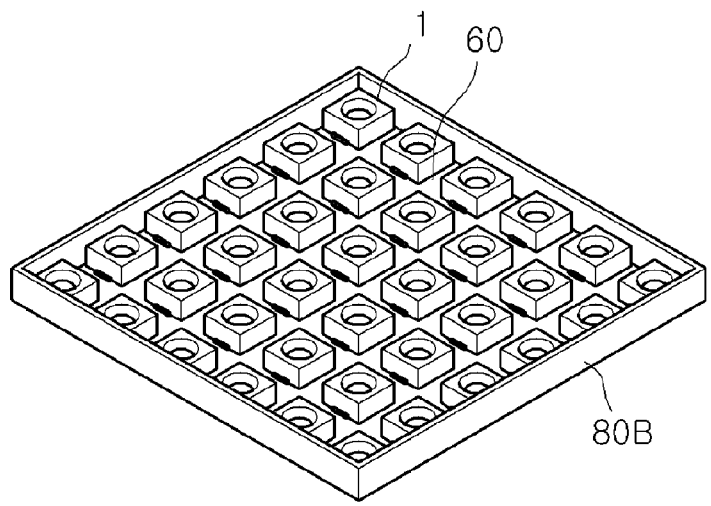

FIG. 5 is a cross-sectional view of a light unit including the light emitting apparatus and FIGS. 6 and 7 are perspective views of a light unit including the light emitting apparatus.

Referring to FIGS. 5 to 7, the light unit includes the light emitting apparatus 1 and a substrate 60 equipped with the light emitting apparatus 1. Further, the light unit may include a support member 80 where the substrate 60 is disposed.

The support member 80 may be variously changed depending on the usage of the light emitting apparatus 1. For example, when the light emitting apparatus 1 is used in the backlight unit, the support member may be a bottom cover. Further, when the light emitting apparatus 1 is used in the lighting device, the support member may be a lighting case.

In particular, when the light emitting apparatus 1 is used in a backlight unit, the substrate 60 may be disposed on at least one inner surface of the support member 80 as shown in FIG. 6 or may be disposed on the bottom of the support member 80 as shown in FIG. 7. However, it is not limited thereto.

The substrate 60 may include, for example, a printed circuit board (PCB), a flexible printed circuit board (FPCB), and the like.

The substrate 60 may include an insulation layer 61 and a circuit pattern 62 disposed on at least one surface of the insulation layer 61. Further, the substrate 60 may include a through-hole 64. The through-hole 64 penetrates the insulation layer 61 to allow the support member 80 to be exposed.

When the circuit pattern 62 is formed on the top and the bottom of the insulation layer 61, the through-hole 64 may be plated with a conductive material to electrically connect the circuit patterns 62 of the top and bottom of the insulation layer 61 to each other. However, the through-hole 64 may not include the conductive material and is not limited thereto.

The heat radiating member 50 that protrudes on the bottom of the body 10 of the light emitting apparatus 1 is inserted into the through-hole 64 to contact the support member 80. At this time, the first and second electrodes 31 and 32 exposed on the outer bottom of the body 10 may be electrically connected with the circuit pattern 62.

That is, the heat radiating member 50 protrudes on the bottom of the body 10 by the first length L. In this case, the first length L may be a length to allow the heat radiating member 50 to be inserted into the through-hole 64 to contact the support member 80 and the first electrodes 31 and 32 to be electrically connected with the circuit pattern 62. For example, the first length L may be in the range of 0.1 to 3 mm.

Since the heat radiating member 50 may contact the support member 80, the heat generated from the light emitting apparatus 1 is effectively transferred to the support member 80 through the heat radiating member 50 to be discharged.

The light emitting device 20 may be disposed in the cavity 15. At this time, the light emitting device 20 may be mounted on the heat radiating member 50.

The light emitting device 20 is electrically connected with the first and second electrodes 31 and 32 and generates light by using electric power received from the first and second electrodes 31 and 32.

The light emitting device 20 may be red, green, blue, or white light emitting diode that generates red, green, blue, or white light or may be a UV light emitting diode that generates ultraviolet rays. The type of the light emitting device 20 is not limited.

Further, the light emitting apparatus 1 may include the plurality of light emitting device 20 and for example, may include light emitting diodes that emit red, green, and blue colors constituting three primary colors of light. Further, the plurality of light emitting devices 20 may all adopt light emitting diodes of the same color or may include light emitting diodes having various colors and it is not limited thereto.

The light emitting device 20 may be electrically connected with the first and second electrodes 31 and 32 by a wire as shown in the figure. However, the light emitting device 20 may be electrically connected with the first and second electrodes 31 and 32 by a die bonding method, a flip chip method, and the like in addition to the wire method and is not limited thereto.

The encapsulant 40 may be formed in the cavity 15 to seal the light emitting device 20.

The encapsulant 40 may protect the light emitting device 20 and may adjust light distribution of the light emitted from the light emitting device 20. Further, the phosphor luminescent substance is included in the encapsulant 40 to adjust the color sense of the light.

Further, a lens (not shown) may be further formed on the body 10. The lens (not shown) may adjust the color sense or light distribution of the light emitted from the light emitting device 20.

Figure 8:
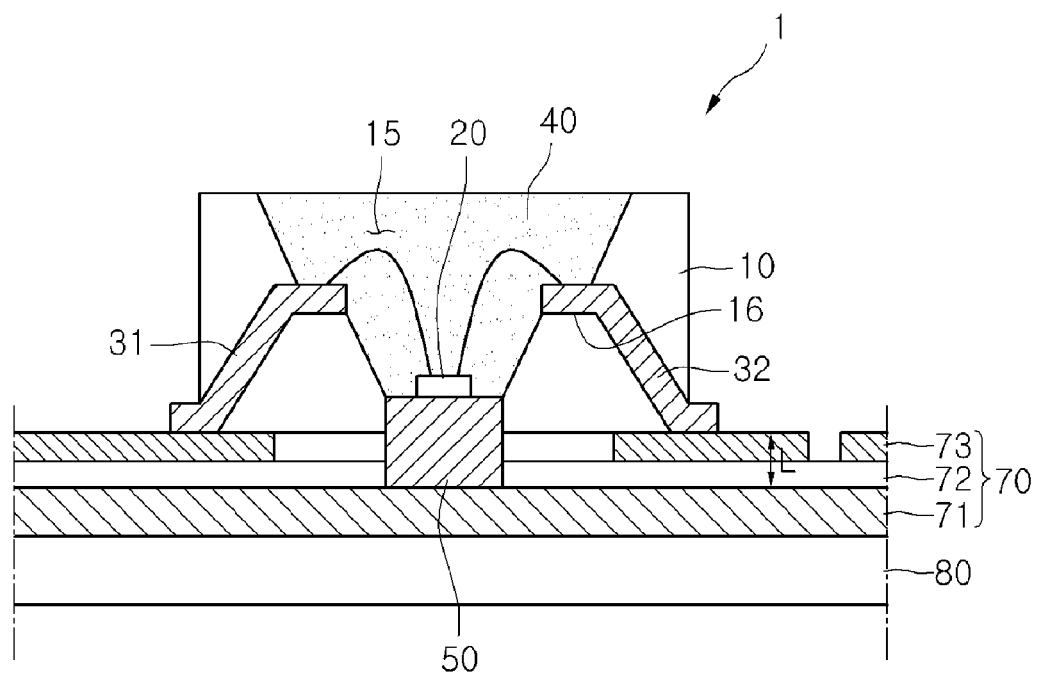
FIG. 8 is another embodiment of the light unit.

FIG. 8, as another embodiment of the light unit, is a diagram illustrating a case in which the light emitting apparatus 1 is mounted on a metal core printed circuit board (MCPCB) 70.

Referring to FIG. 8, the light unit includes the light emitting apparatus 1, the MCPCB 70 equipped with the light emitting apparatus 1, and the support member 80 where the MCPCB 70 is disposed.

The MCPCB 70 may include a metallic layer 71, an insulation layer 72 formed on the metallic layer 71, and a circuit pattern 73 formed on the insulation layer 72.

Further, the MCPCB 70 may include a through-hole 74 of which at least a part of the metallic layer 71 is exposed by selectively removing the insulation layer 72.

The heat radiating member 50 that protrudes on the bottom of the body 10 of the light emitting apparatus 1 is inserted into the through-hole 74 to contact the metallic layer 71. At this time, the first and second electrodes 31 and 32 exposed on the outer bottom of the body 10 may be electrically connected with the circuit pattern 73.

That is, the heat radiating member 50 protrudes on the bottom of the body 10 by the first length L. In this case, the first length L may be a length to allow the heat radiating member 50 to be inserted into the through-hole 74 to contact the metallic layer 71 and the first electrodes 31 and 32 to be electrically connected with the circuit pattern 73. For example, the first length L may be in the range of 0.1 to 3 mm.

Since the heat radiating member 50 contacts the metallic layer 71 and the metallic layer 71 is disposed on the support member 80, the heat generated from the light emitting apparatus 1 is effectively transferred to the support member 80 through the heat radiating member 50 to be discharged.

Hereinafter, a light emitting apparatus 1A according to a second embodiment will be described in detail by focusing on components thereof. In the describing the second embodiment, the same part as the first embodiment will refer to the first embodiment and a duplicated description will be omitted. The light emitting apparatus 1A according to the second embodiment is similar to the light emitting apparatus 1 according to the first embodiment except for the structure of the first and second electrodes.

Figure 9:
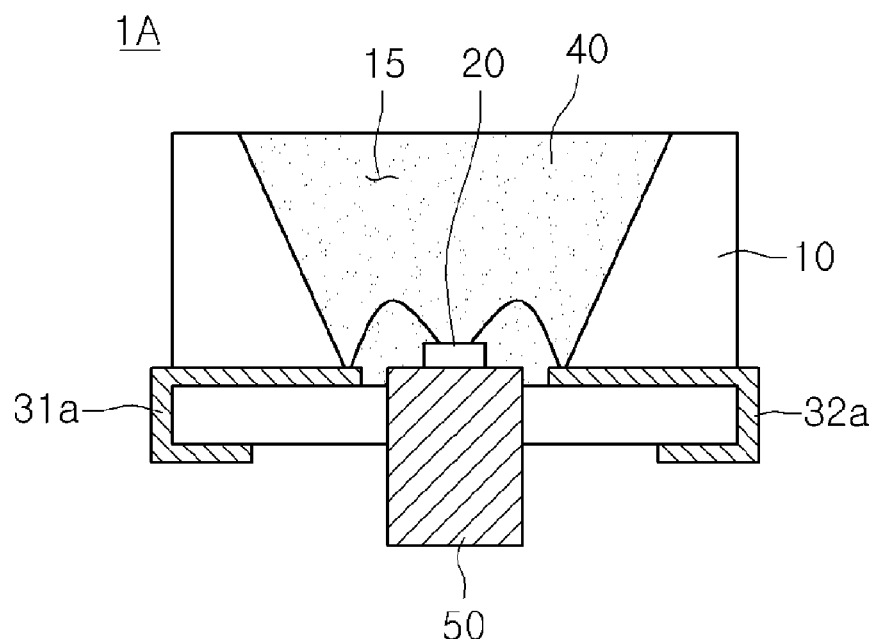
FIG. 9 is a cross-sectional view of a light emitting apparatus according to a second embodiment.

FIG. 9 is a cross-sectional view of a light emitting apparatus 1A according to a second embodiment.

Referring to FIG. 9, the light emitting apparatus 1A includes a body 10 including a cavity 15, a light emitting device 20 in the body 10, a first electrode 31a and a second electrode 32a of which ends are disposed in the body 10 and which are electrically connected with the light emitting device 20, a heat radiating member 50 thermally connected with the light emitting device 20, of which at least a part protrudes from the bottom of the body 10, and an encapsulant 40 formed in the cavity 15 to seal the light emitting device 20. A phosphor luminescent substance may be added to the encapsulant 40.

The cavity 15 may not include the stepped section of the first embodiment.

The one end of each of the first and second electrodes 31a and 32a may be disposed in the body 10 and the other end of each of the first and second electrodes 31a and 32a may be exposed through the outer surface or/and the bottom of the body 10.

The heat radiating member 50 supports the light emitting device 20 and receives heat generated from the light emitting device 20. In addition, the heat radiating member 50 protrudes on the bottom of the body 10 by a first length L to be connected with a substrate or a support member so as to easily transfer heat to the substrate or the support member. Therefore, the heat generated from the light emitting apparatus 1 may effectively emit the substrate or the support member.

Hereinafter, a light emitting apparatus 1B according to a third embodiment will be described in detail by focusing on components thereof. In the describing the third embodiment, the same part as the first embodiment will refer to the first embodiment and a duplicated description will be omitted. The light emitting apparatus 1B according to the third embodiment is similar to the light emitting apparatus 1 according to the first embodiment except for the structures of the first and second electrodes and the heat radiating member.

Figure 10:
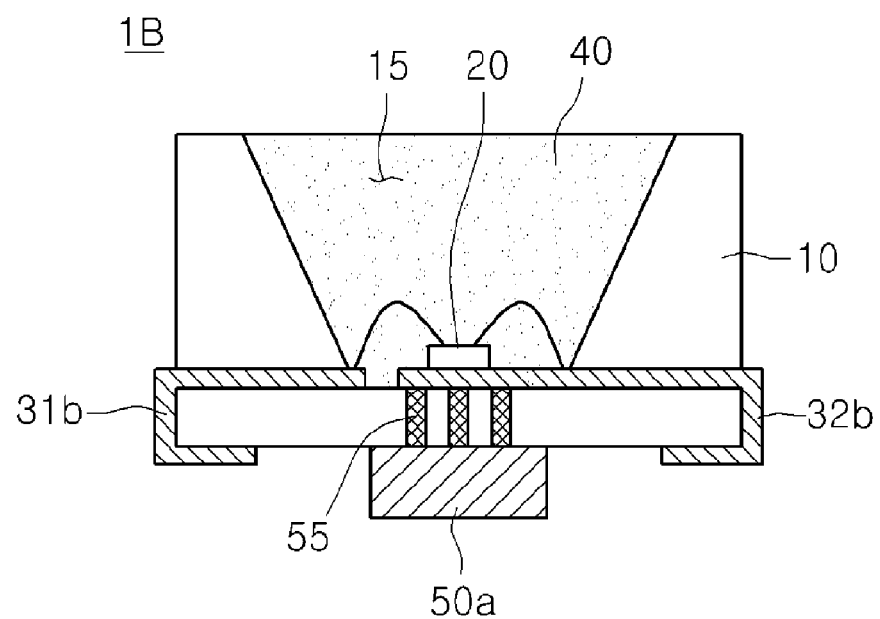
FIG. 10 is a cross-sectional view of a light emitting apparatus according to a third embodiment.

FIG. 10 is a cross-sectional view of a light emitting apparatus 1B according to a third embodiment.

Referring to FIG. 10, the light emitting apparatus 1B includes a body 10 including a cavity 15, a light emitting device 20 in the body 10, a first electrode 31b and a second electrode 32b of which ends are disposed in the body 10 and which are electrically connected with the light emitting device 20, a heat radiating member 50a formed on the bottom of the body 10, at least one heat conducting via 55 thermally connecting the light emitting device 20 and the heat radiating member 50a with each other, and an encapsulant 40 formed in the cavity 15 to seal the light emitting device 20. A phosphor luminescent substance may be added to the encapsulant 40.

The light emitting device 20 may be mounted on any one of the first and second electrode 31b and 32b.

The one end of each of the first and second electrodes 31b and 32b is electrically connected with the light emitting device 20 and the other end of each of the first and second electrodes 31b and 32b is electrically connected with a substrate equipped with the light emitting device 20, and the like to transfer electric power to the light emitting device 20.

The heat radiating member 50a may be formed on the bottom of the body 10 and the height of the heat radiating member 50a may be a first length L which is in the range of 0.1 to 3 mm. The heat radiating member 50a contacts a substrate or a support member to effectively emit heat generated from the light emitting apparatus 1 to the substrate or the support member.

The heat conducting via 55 may thermally connect the heat radiating member 50a with the electrodes 31b and 32b equipped with the light emitting device 20. The heat conducting via 55 may form at least one via hole penetrating the body 10 and may be formed by filling the via hole with a material having high thermal conductivity. The material having high thermal conductivity may be, for example, thermal conductive filler, a thermal conductive adhesive, metal, and the like, but is not limited thereto.

Hereinafter, a light emitting apparatus 1C according to a fourth embodiment will be described in detail by focusing on components thereof. In the describing the fourth embodiment, the same part as the first embodiment will refer to the first embodiment and a duplicated description will be omitted. The light emitting apparatus 1C according to the fourth embodiment is similar to the light emitting apparatus 1 according to the first embodiment except for the existence or not of the encapsulant and the optical film.

Figure 11:
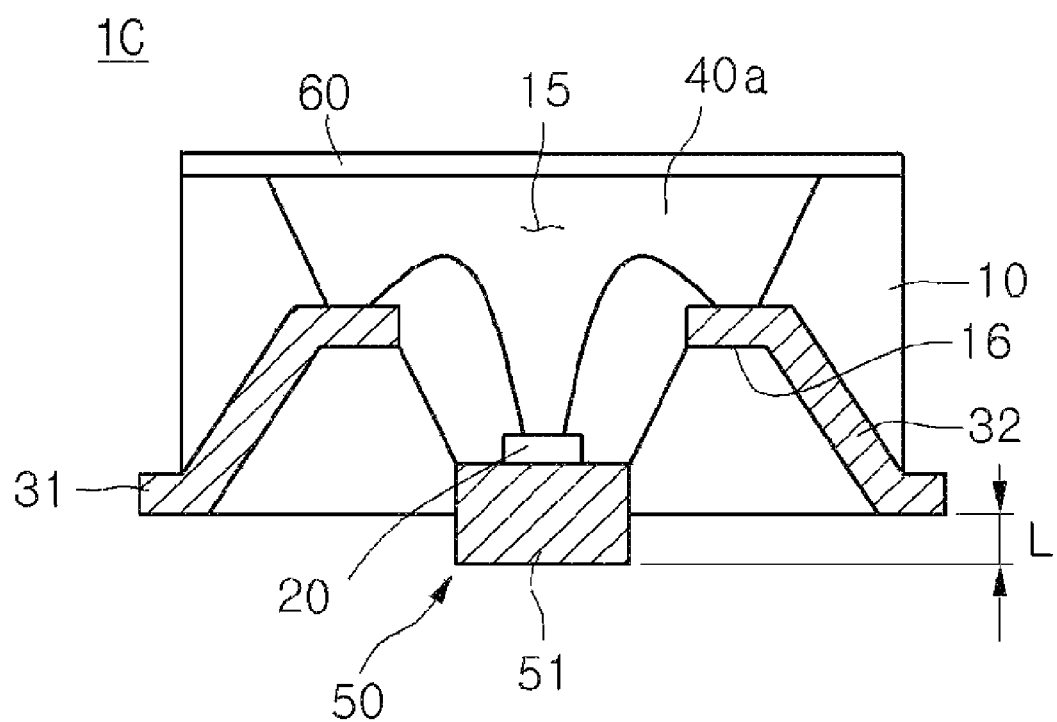
FIG. 11 is a cross-sectional view of a light emitting apparatus according to a fourth embodiment.

FIG. 11 is a cross-sectional view of a light emitting apparatus 1C according to a fourth embodiment.

Referring to FIG. 11, the light emitting apparatus 1C includes a body 10 including a cavity 15, a light emitting device 20 in the body 10, a first electrode 31 and a second electrode 32 of which ends are disposed and which are electrically connected with the light emitting device 20, a heat radiating member 50 thermally connected with the light emitting device 20, of which at least a part protrudes from the bottom of the body 10, an encapsulant 40a formed in the cavity 15 to seal the light emitting device 20, and an optical film 60 formed on the body 10. At least one of the encapsulant 40a and the optical film 60 includes a phosphor luminescent substance. The optical film 60 is disposed outside of the cavity 15 to be supported by the body 10.

The cavity 15 may include a stepped section 16. One end of each of the first and second electrodes 31 and 32 may be disposed at the stepped section 16 and the other end of each electrode may be exposed through the outer surface or/and the bottom of the body 10.

The heat radiating member 50 supports the light emitting device 20 and receives heat generated from the light emitting device 20. In addition, the heat radiating member 50 protrudes on the bottom of the body 10 by a first length L to be connected with a substrate or a support member so as to easily transfer heat to the substrate or the support member. Therefore, the heat generated from the light emitting apparatus 1 may effectively emit the substrate or the support member.

The encapsulant 40a may be formed to seal the light emitting device 20. However, the encapsulant 40a may not be formed or may not include a phosphor luminescent substance.

The optical film 60 may be formed on the encapsulant 40a and the body 10. The optical film 60 may be, for example, a phosphor luminescent film (PLF), a diffusion film, or the like, but is not limited thereto.

If the optical film 60 is the phosphor luminescent film (PLF), the phosphor luminescent film (PLF) may include the phosphor luminescent substance. In addition, the phosphor luminescent substance is excited by the light emitted from the light emitting device 20 to allow the light emitting apparatus 1C to have various color senses.

Embodiments may provide a light emitting apparatus and a light unit having new structures.

Embodiments may provide a light emitting apparatus and a light unit having improved heat radiation characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a body including a cavity;
    an electrode of which one end is disposed in the cavity by penetrating the body and the other end is disposed outside of the body;
    a heat radiating member including a main frame and a sub frame, wherein the main frame is coupled with the body to form the bottom of the cavity and the sub frame extends from the main frame, wherein the uppermost surface of the main frame has a larger area than the lowermost surface of the main frame and the sub frame includes a slope; and
    a light emitting diode installed on the heat radiating member and electrically connected with the electrode,
    wherein a stepped section is formed on the inner surface of the body forming the cavity and juts into the cavity, and the one end of the electrode is disposed at the stepped section, and
    wherein the slope of the sub frame is inclined upwards from the main frame.

2. The light emitting device of claim 1, wherein the sub frame is exposed toward the side of the body.

3. The light emitting device of claim 1, wherein the heat radiating member is electrically separated from the electrode.

4. The light emitting device of claim 1, wherein the bottom of the main frame includes a first part which is disposed on the same horizontal surface as the bottom of the body and a second part which protrudes downwards from the first part.

5. The light emitting device of claim 4, wherein the second part has a smaller width than the first part.

6. The light emitting device of claim 4, wherein the second part protrudes from the first part by 0.1 to 3 mm.

7. The light emitting device of claim 1, wherein the heat radiating member includes a metallic material or a resin material.

8. The light emitting device of claim 1, further comprising an optical film disposed outside of the cavity and supported by the body.

9. The light emitting device of claim 8, wherein the optical film is a phosphor luminescent film including a phosphor luminescent substance or a diffusion film.

10. The light emitting device of claim 1, wherein the other end of the electrode is disposed on the side of the body.

11. A light unit, comprising:
a light emitting device including a body including a cavity, an electrode of which one end is disposed in the cavity by penetrating the body and the other end is disposed outside of the body, a heat radiating member coupled with the body, of which at least a part protrudes downwards from the bottom of the body, and a light emitting diode installed on the heat radiating member and electrically connected with the electrode; and
a substrate disposed below the light emitting device, wherein at least a part of the heat radiating member is inserted into the substrate,
wherein the substrate includes a metallic layer, an insulation layer disposed on the metallic layer and having a through-hole to expose the metallic layer, and a circuit pattern formed on the insulation layer, and at least the part of the heat radiating member is inserted into the through-hole to directly contact the metallic layer.

12. The light unit of claim 11, wherein the heat radiating member includes a main frame forming the bottom of the cavity and a sub frame extending from the main frame and exposed toward the side of the body.

13. The light unit of claim 12, wherein the uppermost surface of the main frame has a larger area than the lowermost surface of the main frame and the sub frame includes a slope which is inclined upwards from the main frame.

14. The light unit of claim 12, wherein the bottom of the main frame includes a first part which disposed on the same horizontal surface as the bottom of the body and a second part which protrudes downwards from the first part.

15. The light unit of claim 14, wherein the second part has a smaller width than the first part and the second part protrudes from the first part by 0.1 to 3 mm.

16. The light unit of claim 11, further comprising an optical film disposed outside of the cavity and supported by the body.

17. The light unit of claim 11, wherein the substrate includes an insulation layer with a plated through-hole, and a circuit pattern formed on the insulation layer, and
at least the part of the heat radiating member is inserted into the plated through-hole.

* * * * *